United States Patent
Schieferdecker et al.

(10) Patent No.: US 6,871,999 B2
(45) Date of Patent: Mar. 29, 2005

(54) METHOD FOR THE CORRECTION OF THE OUTPUT SIGNAL OF AN INFRA RED RADIATION MULTIPLE ELEMENT SENSOR

(75) Inventors: Jörg Schieferdecker, Wiesbaden (DE); Karlheinz Storck, Lorch (DE)

(73) Assignee: Perkinelmer Optoelectronics GmbH, Wiesbaden (DE)

(*) Notice: Subject to any disclaimer, the term of this patent is extended or adjusted under 35 U.S.C. 154(b) by 0 days.

(21) Appl. No.: 10/168,484

(22) PCT Filed: Dec. 22, 2000

(86) PCT No.: PCT/EP00/13185
§ 371 (c)(1),
(2), (4) Date: Sep. 24, 2002

(87) PCT Pub. No.: WO01/48449
PCT Pub. Date: Jul. 5, 2001

(65) Prior Publication Data
US 2003/0091090 A1 May 15, 2003

(30) Foreign Application Priority Data
Dec. 24, 1999 (DE) .......................... 199 62 938

(51) Int. Cl.⁷ .................................................. G01J 5/18
(52) U.S. Cl. .................... 374/128; 374/133; 374/149; 250/252.1; 219/711; 136/224; 702/99
(58) Field of Search ................................ 374/128, 133, 374/149, 120, 121; 136/224; 702/104, 99, 134, 135; 250/252.1, 338.1; 219/710, 711

(56) References Cited
U.S. PATENT DOCUMENTS
5,528,519 A  6/1996  Ohkura et al. .............. 702/104
5,811,808 A  9/1998  Cannata et al. ............. 250/332
5,876,120 A  3/1999  Lee ............................. 374/149
6,354,733 B2 * 3/2002  Glasheen et al. ........... 374/120

FOREIGN PATENT DOCUMENTS

| DE | 4113266 | 10/1991 | ............ G01J/5/00 |
| DE | 4114369 | 11/1991 | ............ G01J/5/10 |
| DE | 4139122 | 4/1993 | ............ A61B/5/00 |
| DE | 4234366 | 7/1994 | ............ H05B/6/68 |
| DE | 19707797 | 10/1997 | ............ F24C/7/02 |
| EP | 0599494 | 6/1994 | ............ G01J/5/60 |
| EP | 0898159 | 2/1999 | ............ G01J/5/10 |
| WO | WO96/10883 | 4/1996 | ............ H04N/3/09 |

* cited by examiner

Primary Examiner—Christopher W. Fulton
Assistant Examiner—Stanley J. Pruchnic, Jr.
(74) Attorney, Agent, or Firm—Wood, Herron & Evans, LLP

(57) ABSTRACT

A method for the correction of the output signal of an infra red radiation multiple element sensor comprises the steps of determining and storing a parameter of a sensor element of the sensor and of generating a corrected signal of the sensor element in accordance with the stored parameter, where the storage of the parameter takes place in a memory supplied by the manufacturer and where prior to the correction being carried out, the parameter is transmitted to a correction device which is separate from the sensor. A sensor has several sensor elements (11a to 11i) which generate an output signal and a memory (14) provided on the sensor for the storage of at least one parameter of at least one sensor element. A sensor system has a sensor (20) as described earlier, a socket (31) which can be connected with the sensor for the purpose of signal transmission and a correction device (32) connected to the socket for receiving the sensor output signal and the parameters and for the generation of a corrected sensor signal.

96 Claims, 4 Drawing Sheets

Figure 1:
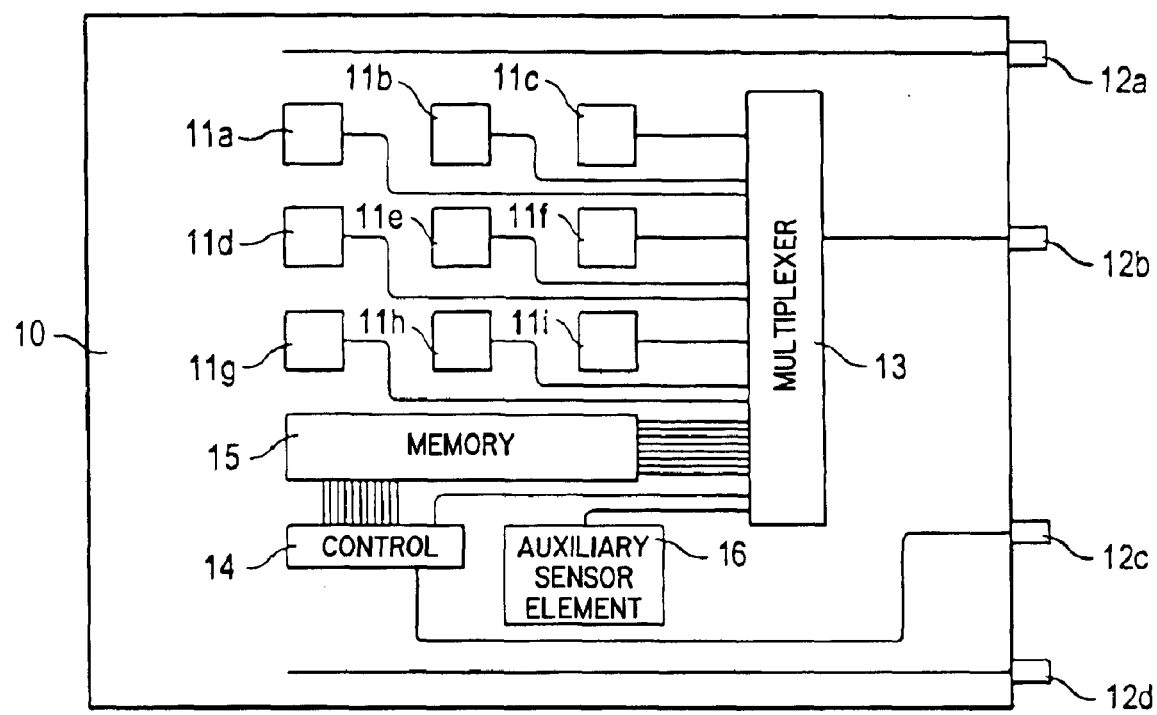

METHOD FOR THE CORRECTION OF THE OUTPUT SIGNAL OF AN INFRA RED RADIATION MULTIPLE ELEMENT SENSOR

The invention relates to a method for the correction of the output signal of an infra red radiation multiple element sensor, an infra radiation multiple element sensor and an infra red radiation multiple element sensor system. The invention therefore relates to sensors in which several sensor elements are able to generate different signals. The sensors are radiation sensors for infra red radiation.

A multiple element sensor is known from DE 19 735 379 A1 where the output signals of sensor elements pass through a calibration installation in order to adjust the characteristics of the respective sensor elements. The calibration can be, for example, carried out with "fusible links"—stored calibration values. The entire structure is located immediately in the sensor and puts out calibrated values. This structure is costly, because it is necessary either to create complex transfers between the analogue and the digital paths, or to provide an arithmetic logic unit.

It is the purpose of the invention to provide a correction method for output signals of an infra red radiation multiple element sensor and an infra red radiation multiple element sensor system which makes possible a simple, reliable and cost-effective correction of sensor element signals.

From U.S. Pat. No. 5,811,808 an infrared imaging system is known, where each sensor element has an offset correction and an offset correction circuitry in each read out cell. This structure is costly, because it adds to the complexity of the sensory system.

DE 41 14 369 A relates to a pyrometer employing a microprocessor, but it is not disclosed how the correction data, available in a calibration value memory, is obtained, nor where the memory is located.

From DE 41 13 266 A another pyrometer system is known, where all the correction values are held in a memory that belongs to the microprocessor. Also within this document no technical thought is given how to achieve the later on mentioned objects of the present invention.

It is the purpose of the invention to provide a correction method for output signals of an infra red radiation multiple element sensor and an infra red radiation multiple element sensor system which makes possible a simple, reliable and cost-effective correction of sensor element signals.

This purpose is achieved by means of the characteristics of the independent Claims. Dependent Claims relate to the preferred embodiment of the invention.

In a method or procedure for the correction of the output signals of an infra red radiation multiple element sensor, at least one parameter of a radiation sensor element is determined and stored in a memory supplied with the infra red radiation multiple element sensor from which it can be read and transmitted to a device outside the sensor and used to correct the received signal. An infra red radiation multiple element sensor has, apart from several radiation sensor elements, also a memory into which parameters of the sensor elements can be written in and from which they can be read out.

An infra red radiation multiple element sensor system comprises a sensor as described above, a socket to which the sensor can be connected and from which it can be disconnected and which can receive signals at least from the sensor and a correction device which on the one hand receives sensor output signals which depend on sensor element signals and on the other hand the stored parameters or signals generated in accordance therewith, the final signal being generated in accordance with the sensor output signal and the parameter.

The memory can be a digital memory, for example a PROM (programmable read-only memory) or an EPROM (erasable programmable read-only memory) The radiation sensor elements can be thermopiles. They can have their sensitivity maximum in the wavelength area of 700 nm<$\lambda$ and/or $\lambda$<20 $\mu$m, in particularly 7 $\mu$m<$\lambda$ and/or $\lambda$<15 $\mu$m The actual correction of the raw sensor signal in dependence of, or in accordance with, the parameter accordingly takes place in a correction device which is provided separately from the infra red radiation multiple element sensor (and which is hereinafter called simply the "sensor"), but which can be connected thereto. Preferably, this is a correction device which functions digitally and it can also be a computer or a processing computer. This can perform other tasks, for example, the evaluation of the corrected sensor signals in accordance with certain criteria or also the control or the adjustment of components according to signals sent by the sensor.

The sensor is a multiple element sensor with several sensor elements. They can be arranged in such a way that a local resolution can be obtained. They can receive the radiation of interest via an imaging device. The imaging device can have a concave mirror and/or a lens.

The sensor can have an auxiliary sensor element. The auxiliary sensor element can register operating data of the sensor elements which influence the output signals of the sensor elements, for example, their working temperature. In addition, a correction value for the auxiliary sensor element can be stored in the memory and then used for the correction of the signal of the auxiliary sensor element.

Figure 2:
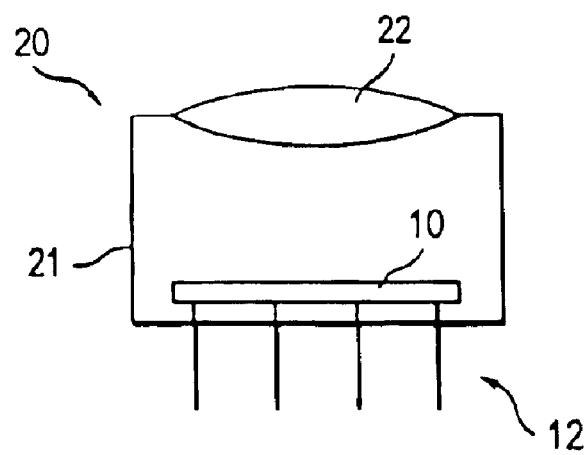
Figure 3:
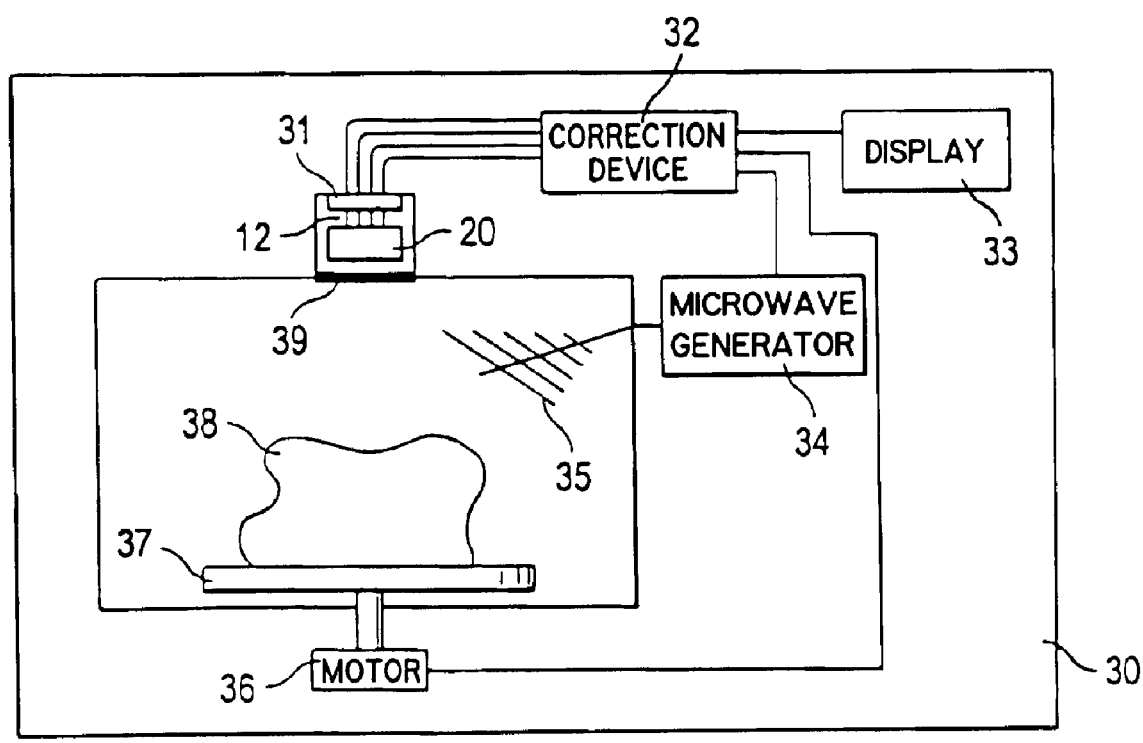
Figure 4A:
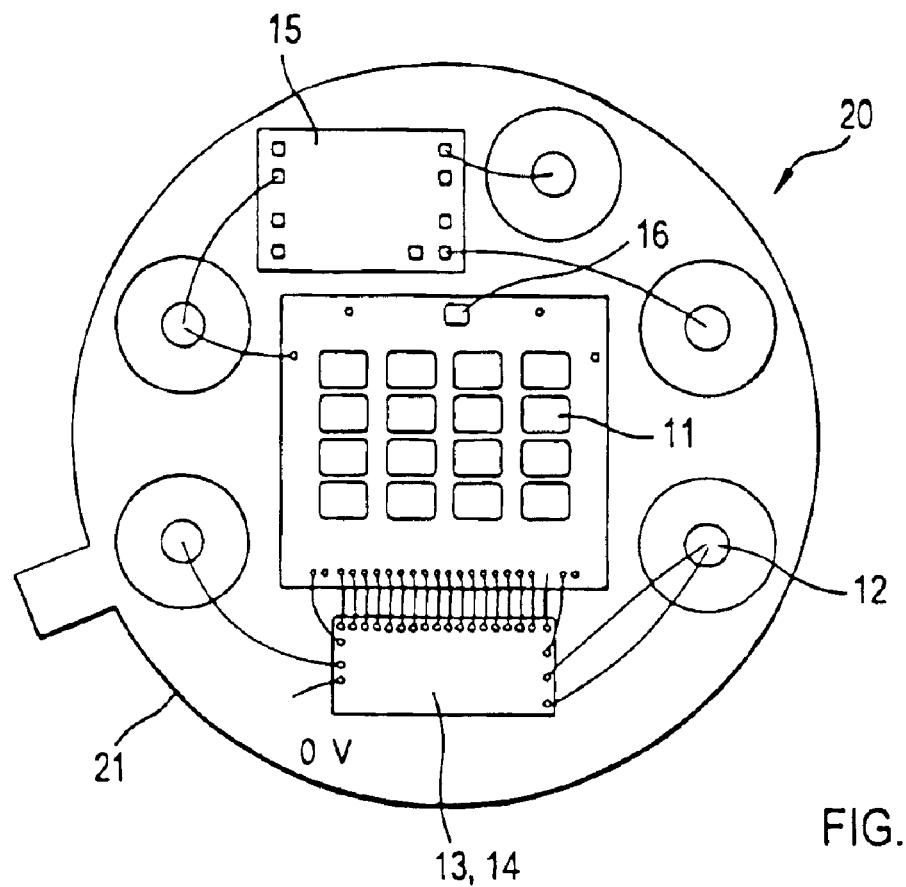
Figure 4B:
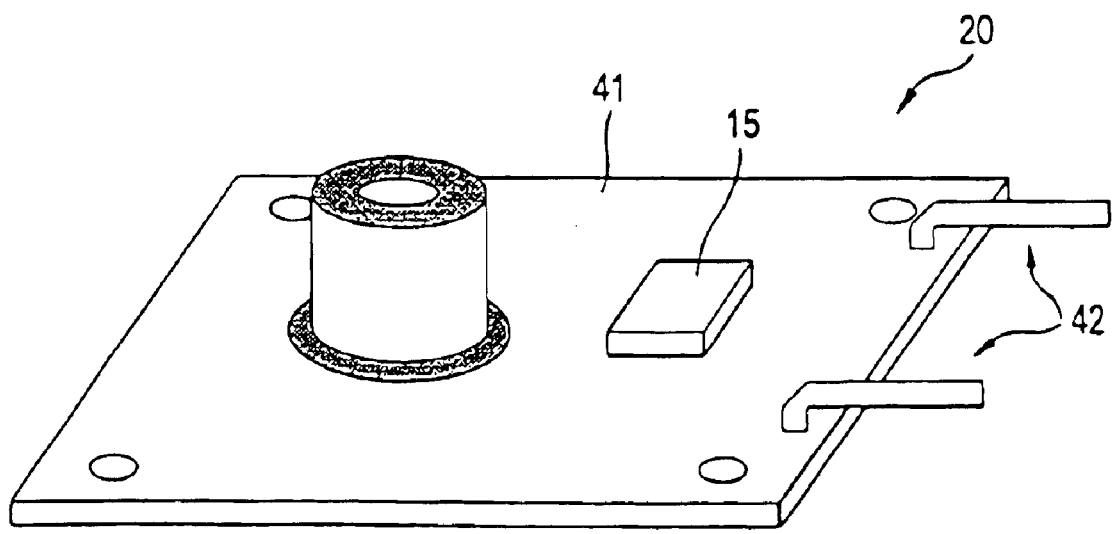
Figure 5:
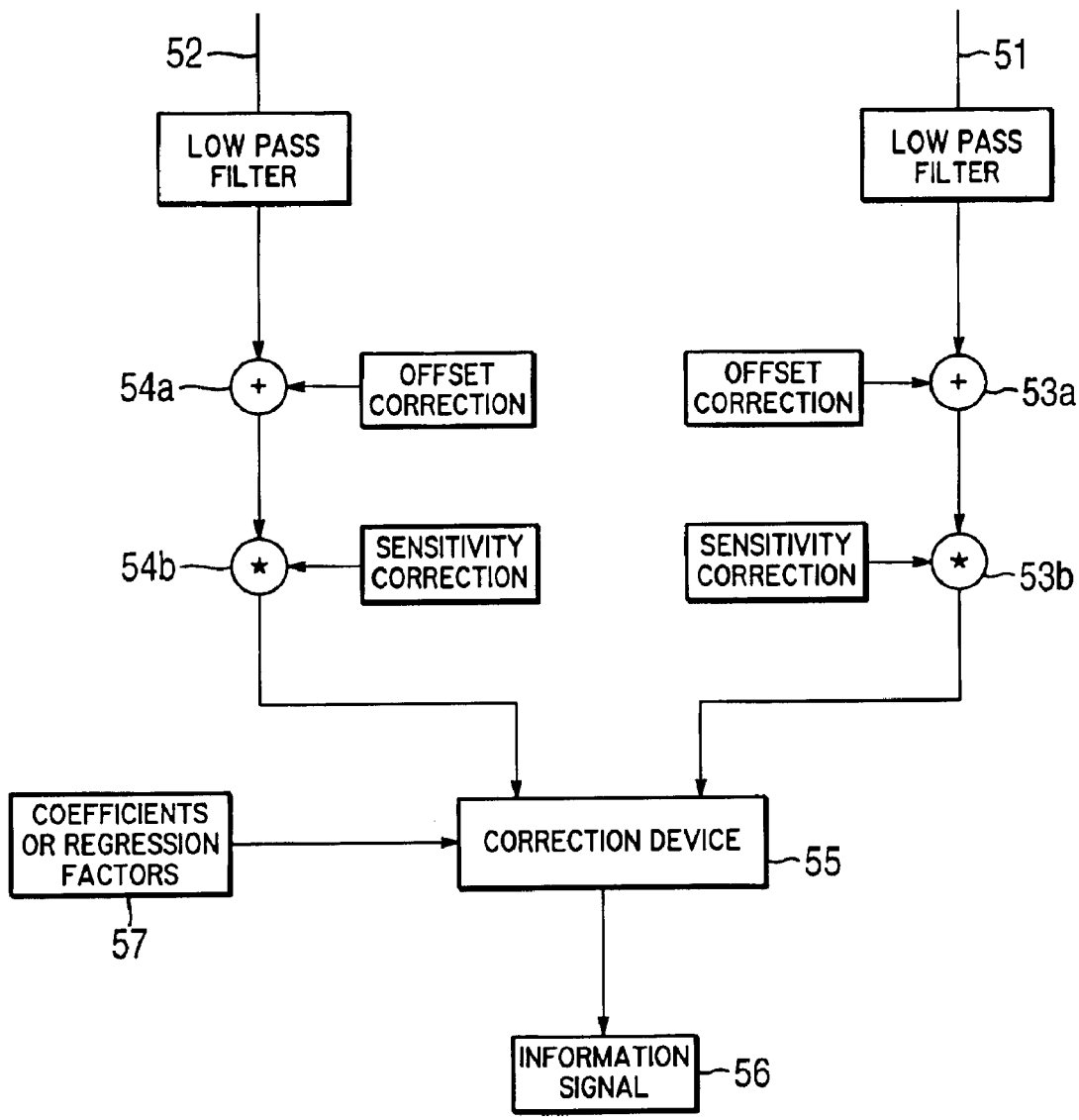

Next, individual embodiments of the invention are described with reference to the drawings:

FIG. 1 is a schematic block diagram of a sensor according to the invention,

FIG. 2 is a schematic view of a sensor according to the invention used as a component, FIG. 3 is a diagram of a sensor system according to the invention, FIGS. 4A and 4B are diagrams of various possible constructions of a sensor and FIG. 5 is a signal flow plan FIG. 1 shows diagrammatically a sensor 10 according to the invention. It has sensor elements 11a to 11i which generate output signals independently of one another. These can be, for example, thermopile sensor elements and/or bolometers and/or pyrodetectors, which generate electrical signals independently of one another according to the quantity of radiation received. They can receive radiation impinging on them through an imaging device. The sensor elements 11a to 11i can be arranged regularly in a plane, rather like a matrix (e.g. according to lines and columns).

The sensor is preferably an uncooled sensor and is preferably a thermal sensor which generates its electrical signal according to the heat produced by the irradiation of the sensor element.

12 refers to terminals or connections of the sensor 10. Various terminal or connection configurations are possible. One embodiment is shown in which the sensor 10 has connections 12a and 12d for operating voltage (internal distribution is indicated only diagrammatically), a signal output 12b and a control input 12c. The signal output 12b receives an electrical signal from an analogue multiplexer 13 which receives the analogue signals of individual components in parallel and puts them out in time-serial manner. In the embodiment shown, the output signals of the subsequently described memory 15 and of the also subsequently described auxiliary sensor element run through the multiplexer 13. In other configurations, it is possible to provide individual outputs for single or several of the components named. It is also possible to provide a separate data input and output for the memory, this however not being illustrated here. For signals to be transmitted, it is for example possible to implement an I²C interface or a CAN interface.

15 is a memory in which one or more parameters of the sensor elements 11a to 11i are stored. According to the area of application, manufacturing processes and the desired degree of accuracy, it may for example be adequate to specify a global parameter for all sensor elements (e.g. average sensitivity or zero point shift). Individual solutions are also feasible, where for every sensor element one or more parameters are individually stored in memory (e.g. zero point shift and/or sensitivity).

The parameters are those which are relevant for the respective output signal. They can be coefficients of polynomial approximations (representation of the output signal as a polynom according to the magnitude of the output signal with coefficients for the constant, linear, quadratic, cubic . . . member according to the required accuracy). Apart from this, it is possible to store further data in memory 15, for example the date of manufacture, type, batch number and the like.

The memory can be a PROM (programmable read-only memory) or an EPROM (erasable programmable read-only memory). The size of memory 15 should be selected in bits or bytes according to the quantity of data to be stored. The data input of memory 15 can be parallel or serial. The output of data can take place in parallel serially.

In general, 14 designates a control which controls the components of sensor 10. It can act on the multiplexer 13. It can moreover generate write—or read—addresses for memory 15. It can be linked to a connection of the sensor 10, in particular with control connection 12c. Through this connection it can receive control signals. Other possibilities for the transmission of control signals to the sensor are conceivable, particularly to control 14, for example, by superimposing control signals or modulations on certain worked-up connections (e.g. the supply voltage). An evaluation device 14 can recognise such signals and use them for other purposes.

16 is an auxiliary sensor element which serves for the detectation of operating conditions of the sensor elements 11a to 11i. It can, for example, be a temperature sensor. Its output signal can be (as shown) led to the signal output 12b via the multiplexer 13. It can also be put out separately. A parameter can also be stored in memory 15 for the auxiliary sensor element (16) (e.g. sensitivity, offset) and possibly put out.

Multiplexer 13 can be an analogue multiplexer which chronologically switches the analogue output signals of the sensor elements 11a to 11i and possibly the auxiliary sensor element 16, analogue-fashion to the signal output 12b. If analogue/digital converters are provided, multiplexer 13 can also be a digital multiplexer.

FIG. 2 shows diagrammatically the construction of the sensor 20. 10 are the electrical components of the sensor as described in FIG. 1, 12 are the electrical connections, 21 is the sensor housing which can, in particular, have metal walls to act as electromagnetic shields.

It can be a TO5 housing. An optical imaging device which depicts the radiation impinging on the sensor elements 11a to 11i, can be provided in the housing. The imaging device 22 can contain a lens and/or a mirror/concave mirror. It can be coated with a transparent conducting layer.

The sensor elements 11a to 11i themselves can be thermopile sensor elements and/or bolometer sensor elements, which are sensitive to static temperature signals (the output signal is a measure of the radiation impinging on the sensor element). There are also other radiation recipients, for example pyro-electric sensor elements which principally are sensitive to temperature change signals and give no output signal at a constant temperature (typical values are a sensitivity maximum at a frequency of 0.1 Hz, from 1 Hz a reduction in sensitivity inversely proportional to frequency). In certain embodiments, such sensor elements can also be provided. Mixed forms are also feasible (some sensor elements being thermopiles, some bolometers and some pyroelectric)

Following the manufacture of sensor 10, the parameters of the sensor elements 11 and possibly of the auxiliary sensor element 16 are determined and stored in memory 15. This is preferably done immediately after manufacture by the manufacturer. For this purpose, the sensor can be incorporated in a test stand which makes available defined conditions for the sensor such that the target sensor element signals are known. From the difference between the target and actual sensor element signals, it is possible to determine the parameters by means of an external device. They are preferably determined in digital form and then loaded into the memory 15 of sensor 10. The loading takes place via a suitable activation of sensor 10 components, in particular via the control and data signals, for example on the control connection 12c through control 14 or multiplexer 13.

After the sensor has been so prepared, it can be marketed. For use, the sensor is inserted into an appropriate socket which establishes a signal-related and particularly electrical and mechanical connection to the sensor. The electrical connection is normally implemented galvanically. Before the actual measuring operation of sensor 10 begins, the parameters of sensor elements 11a to 11i and possibly of the auxiliary elements 16 stored in memory 15 are read out. For this purpose, the required components (control 14, memory 15, control connection 12c and possibly multiplexer 13 or the interface) are suitably activated, whereby the parameters in memory 15 are transmitted by the sensor 10 to a device which is outside the sensor. The parameters can also be stored outside the sensor and then used for the correction of the sensor output signals or in particular, of the output signals of the sensor elements 11a to 11i or of the auxiliary sensor element 16.

For the production of the last corrected sensor signals it is possible to use the immediate output signals of the sensor elements 11a to 11i, possibly the output signal of the auxiliary sensor element 16 which registers the operating conditions of the sensor elements 11a to 11i and which can influence their output signals (for example the operating temperature), and the correction values read out from memory 15.

The correction of a raw sensor element signal can, for example, follow via regression factors. The correction can be made by computer by regarding the raw sensor element signal as the input quantity and the corrected sensor element signal as the output quantity and a coefficient-encumbered formula is used for the conversion. The coefficients of the formula can be the parameters stored in memory 15 of the sensor. For example, an error function (corrected signal in accordance with the raw signal) can be approached via a Taylor series, where, depending on desired accuracy, a variable number of terms of the series can be used (e.g.

constant, linear and square, whilst cubical and higher are not taken into account). The parameters would be the coefficients of the single terms of the polynom to be taken into account. Other correction mechanisms are, however, conceivable, for example of a tabular type where according to the raw sensor element signal, a table is addressed and the corrected signal element value is determined according to the value found in the table.

The production of the final output signal takes place in a correction device which is provided outside sensor 10. The correction preferably takes place in digital form. The raw output signals of the sensor elements 11a to 11i and possibly of the auxiliary sensor element 16 are converted analogically/digitally in a suitable place and the correction follows as set out earlier, for example additively/multiplicatively via tables or other formulae. Finally, the corrected signals are ready, preferably in digital form, for further evaluation.

FIG. 3 shows a sensor system as incorporated in an application. For example, this can be a microwave application in which the actual sensor 20 serves for the determination of the temperature of a substance 38 (a meal) to be heated up in a microwave oven 30. The temperature of the substance 38 is determined by sensor 20 on the basis of the radiation which it emits and which the sensor receives. Sensor 20 can be connected to a socket 31 which establishes the mechanical and signal-related connection with sensor 20. The socket 31 is connected to a correction device 32 which receives the sensor element/raw output signals and corrects the same in accordance with the parameters stored in the correction device 32.

Apart from the application in microwave ovens described by way of example, the sensor system offers advantages in numerous other applications, e.g. in the measurement of room temperatures in the areas of industry, the household or motor vehicles, or for the detection of persons in security or buildings monitoring.

A specific application is non-dispersive infra red absorption (NDIA). Here, a wavelength filter is set up in front of every sensor element where different sensor elements receive different wavelength ranges. The sensor elements are irradiated by a wide-band infra red source and are thereby able to measure different absorption by means of mixed media between the source of radiation and the sensor. The transmission bands of the individual filters are adapted to the absorption spectra of any expected substance. A maximum signal of a sensor element at a given level of irradiation by an infra red source signifies a total absence from the mix of those components for which the sensor element is sensitized by means of its filter. If the calibration takes place after the setting up of the filters, any irregularity of the filters themselves can be calibrated out. In this embodiment, it is possible to omit a common imaging device (lens, mirror) so that the infra red source is no longer imaged on one of several sensor elements. Every element can, however, have its own imaging device. With this embodiment, it is possible to analyse transparent mixtures by making use of the different infra red absorption properties of the individual components of the mix. The higher the percentage of a component in a mix, the more it will absorb the infra red light of its absorption wavelength so that the sensor which is allocated to this particular wavelength will receive that much less radiation. Using this technique, mixtures of fluids and in particular, gas mixtures, can be analysed.

The correction device 32 is preferably a digital device which performs the correction by means of a computer. This can be, for example, a process computer which also performs other tasks such as the evaluation of individual sensor elements for the determination of, for example, the temperature of objects and the activation of components according to the data found. For example, a microwave generator 34 can be activated for a microwave antenna 35 or a motor 36 which turns a rotating table 37.

In the correction device 32 it is also possible to use the output signal of an auxiliary sensor element 16 which may be present for the correction of raw element output signals. In addition, the raw output signal of the auxiliary sensor element 16 itself can be corrected according to one or more parameters of the auxiliary sensor element. This parameter can also be stored in memory 15 of sensor 10 and transmitted to the correction device 32. A display 33 can be activated according to the results obtained.

The reading out of data from memory 15 of the sensor can take place once at the beginning of the activation of the sensor in any application. It is then possible to provide suitable memories, for example programmable read-only memories, for the storage of these data outside the sensor. The reading can also take place each time before the start of operation of the device (e.g. switching on). The data read out from memory 15 can then be stored in a volatile memory e.g. in a random access memory.

FIGS. 4A and 4B show embodiments of the sensor. FIG. 4A shows a hybrid structure in a TO housing (e.g. TO5). Separate chips for memory 15, the matrix of sensor elements 11 and the control and the interface 13,14 are provided and electrically interconnected via bond connections. Instead of a hybrid construction as shown in FIG. 4A, it is possible to choose a monolithic structure where all the cited components (memory, sensor elements, control, multiplexer) are located on a single chip.

FIG. 4B shows a modular arrangement where plugs 42 are provided on a printed circuit board 41 which form the sockets 12 of the sensor. The data memory 15 is introduced on the circuit board as a discrete element, the thermopile multiple element sensor sector with appropriate signal processing as a further discrete element.

FIG. 5 shows diagrammatically the signal flow for the determination of the corrected output signal for a sensor element. 51 is the input for the uncorrected signal of the sensor element, 52 is the input for the uncorrected signal of the auxiliary element 16 (e.g. the operating temperature signal for the sensor element to be evaluated), 53a symbolises an additive offset correction, 53b a multiplicative sensitivity correction. The correction values can be the parameters of the sensor element concerned stored in memory 15 of the sensor and transmitted to the correction device 32, 54a is an additive offset correction for the auxiliary sensor element and 54b a multiplicative sensitivity correction for the same. Here, too, the correction values used can be taken from memory 15 of the sensor beforehand and stored in the correction device 32, 55 is a correction device in a narrower sense in which it is possible to make use of formulae or tables in order, on the one hand, to determine from the corrected sensor signal and on the other hand from the corrected auxiliary sensor signal, the desired information signal 56, for example the temperature of the object which emits the radiation received by the sensor. The correction device 55 can make use of coefficients or regression factors 57, if formulae are used for the determination of the information signal 56. The quoted parameters (additive offset correction, multiplicative sensitivity correction, coefficients, regression factors) can be stored in the non-volatile memories of the correction device 32.

In a further embodiment, a programme code can also be stored in memory 15 which is read out on the activation of the sensor (preferably once, in order to be stored outside the sensor), where the programme code is a programme which serves for the correction of the sensor element signals. In this way, the correction can be made not only in respect of individual parameters, but also in respect of individually tailored correction algorithms which are carried out outside the sensor.

The invention is particularly meaningful in the case of multiple element sensors, where the individual sensor elements can have characteristics which differ from one another, for example individual characteristic curves. This is particularly the case with the aforementioned radiation recipients (pyro-element, thermopile, bolometer). For such sensors, it is possible to determine the correction for every individual sensor element in advance. The "intelligence" of assessment outside the sensor can also be utilised for smoothing out the irregularities of the individual characteristic curves. This results in cost advantages, since the irregularity must be smoothed out to a limited extent during the process of manufacture by the manufacturer of the sensor elements themselves.

What is claimed is:

1. A method for the correction of the output signal of an infra red radiation multiple element sensor comprising the steps of:

determining and storing a parameter of a sensor element of the sensor and generating a corrected signal according to the output signal of the sensor element and the stored parameter, characterized in that the sensor is mounted in a socket, parameters for correcting zero point shift and sensitivity of every sensor element of the sensor are stored in a digital memory provided on the sensor and that prior to the correction taking place, these parameters are transmitted from the memory through the socket to a correction device which is coupled to the socket and separate from the sensor.

2. A method according to claim 1, characterized in that one or more of the following parameters are stored, namely, coefficients of polynomial approximations, tabular correction values, manufacturing data, dependence on environmental conditions.

3. A method according to claim 2, characterized in that correction takes place digitally.

4. A method according to claim 3, characterized in that the correction takes place in a device which is also designed for the evaluation of signals and/or the control or adjustment of a device in accordance with the corrected signal.

5. A method according to claim 3, characterized in that the parameter of an auxiliary sensor element can be stored and used for correction.

6. A method according to claim 2, characterized in that the parameter of an auxiliary sensor element can be stored and used for correction.

7. A method according to claim 6, characterized in that the parameter of an auxiliary sensor element can be stored and used for correction.

8. A method according to claim 1, characterized in that correction takes place digitally.

9. A method according to claim 8, characterized in that the correction takes place in a device which is also designed for the evaluation of signals and/or the control or adjustment of a device in accordance with the corrected signal.

10. A method according to claim 9, characterized in that the parameter of an auxiliary sensor element can be stored and used for correction.

11. A method according to claim 8, characterized in that the parameter of an auxiliary sensor element can be stored and used for correction.

12. A method according to claim 1, characterized in that the parameter of an auxiliary sensor element can be stored and used for correction.

13. An infra red radiation multiple element sensor with several sensor elements which generate an output signal, comprising a digital memory provided on the sensor for storing zero point shift and sensitivity for all sensor elements of the sensor, characterized by an interface device via which the parameter relating to zero point shift and sensitivity for all sensor elements can be transmitted away from the sensor via a socket in which the sensor is mounted to a correction device coupled to the socket and separate from the sensor.

14. A sensor according to claim 13, characterized in that the interface device has an I$^2$C interface.

15. A sensor according to claim 14, characterized by several terminals where the transmission of the parameter takes place via a terminal via which the output of a sensor signal can take place.

16. A sensor according to claim 14, characterized by a multiplexer which in a time-series manner places the output signals of the sensor elements one after another on a terminal.

17. A sensor according to claim 14, characterized in that the memory has a programmable read-only memory or an erasable programmable read-only memory.

18. A sensor according to claim 14, characterized in that the sensor elements and the memory are of a monolithic construction.

19. A sensor according to claim 14, characterized in that the sensor elements and the memory are of a hybrid construction.

20. A sensor according to claim 14, characterized by an auxiliary sensor element for which one or more parameters are stored in the memory.

21. A sensor according to claim 14, characterized in that it is housed in a TO5 housing.

22. A sensor according to claim 14, characterized in that the sensor element is a thermopile.

23. An infra red radiation sensor system characterized by a sensor according to claim 14, a socket being connected to the sensor for the purpose of transmission and a correction device being connected to the socket for receiving the sensor output signal and the parameters and for the generation of a corrected sensor signal.

24. A sensor system according to claim 23, characterized in that the correction device is also designed for the evaluation of signals and/or the control or adjustment of a device in accordance with the corrected signal.

25. A microwave heating device characterized by a sensor system according to claim 24 where the sensor elements possess thermopile sensor elements.

26. A microwave heating device characterized by a sensor system according to claim 23 where the sensor elements possess thermopile sensor elements.

27. A sensor according to claim 13, characterized by several terminals where the transmission of the parameter takes place via a terminal via which the output of a sensor signal can take place.

28. A sensor according to claim 27, characterized by a multiplexer which in a time-series manner places the output signals of the sensor elements one after another on a terminal.

29. A sensor according to claim 27, characterized in that the memory has a programmable read-only memory or an erasable programmable read-only memory.

30. A sensor according to claim 27, characterized in that the sensor elements and the memory are of a monolithic construction.

31. A sensor according to claim 27, characterized in that the sensor elements and the memory are of a hybrid construction.

32. A sensor according to claim 27, characterized by an auxiliary sensor element for which one or more parameters are stored in the memory.

33. A sensor according to claim 27, characterized in that it is housed in a TO5 housing.

34. sensor according to claim 27, characterized in that the sensor element is a thermopile.

35. An infra red radiation sensor system characterized by a sensor according to claim 27, a socket being connected to the sensor for the purpose of transmission and a correction device being connected to the socket for receiving the sensor output signal and the parameters and for the generation of a corrected sensor signal.

36. A sensor system according to claim 35, characterized in that the correction device is also designed for the evaluation of signals and/or the control or adjustment of a device in accordance with the corrected signal.

37. A microwave heating device characterized by a sensor system according to claim 36 where the sensor elements possess thermopile sensor elements.

38. A microwave heating device characterized by a sensor system according to claim 35 where the sensor elements possess thermopile sensor elements.

39. A sensor according to claim 13, characterized by a multiplexer which in a time-series manner places the output signals of the sensor elements one after another on a terminal.

40. A sensor according to claim 39, characterized in that the memory has a programmable read-only memory or an erasable programmable read-only memory.

41. A sensor according to claim 39, characterized in that the sensor elements and the memory are of a monolithic construction.

42. A sensor according to claim 39, characterized in that the sensor elements and the memory are of a hybrid construction.

43. A sensor according to claim 39, characterized by an auxiliary sensor element for which one or more parameters are stored in the memory.

44. A sensor according to claim 39, characterized in that it is housed in a TO5 housing.

45. A sensor according to claim 39, characterized in that the sensor element is a thermopile.

46. An infra red radiation sensor system characterized by a sensor according to claim 39, a socket being connected to the sensor for the purpose of transmission and a correction device being connected to the socket for receiving the sensor output signal and the parameters and for the generation of a corrected sensor signal.

47. A sensor system according to claim 46, characterized in that the correction device is also designed for the evaluation of signals and/or the control or adjustment of a device in accordance with the corrected signal.

48. A microwave heating device characterized by a sensor system according to claim 47 where the sensor elements possess thermopile sensor elements.

49. A microwave heating device characterized by a sensor system according to claim 46 where the sensor elements possess thermopile sensor elements.

50. A sensor according to claim 13, characterized in that the memory has a programmable read-only memory or an erasable programmable read-only memory.

51. A sensor according to claim 50, characterized in that the sensor elements and the memory are of a monolithic construction.

52. A sensor according to claim 50 characterized in that the sensor elements and the memory are of a hybrid construction.

53. A sensor according to claim 50, characterized by an auxiliary sensor element for which one or more parameters are stored in the memory.

54. A sensor according to claim 50, characterized in that it is housed in a TO5 housing.

55. A sensor according to claim 50, characterized in that the sensor element is a thermopile.

56. An infra red radiation sensor system characterized by a sensor according to claim 50, a socket being connected to the sensor for the purpose of transmission and a correction device being connected to the socket for receiving the sensor output signal and the parameters and for the generation of a corrected sensor signal.

57. A sensor system according to claim 56, characterized in that the correction device is also designed for the evaluation of signals and/or the control or adjustment of a device in accordance with the corrected signal.

58. A microwave heating device characterized by a sensor system according to claim 57 where the sensor elements possess thermopile sensor elements.

59. A microwave heating device characterized by a sensor system according to claim 56 where the sensor elements possess thermopile sensor elements.

60. A sensor according to claim 13, characterized in that the sensor elements and the memory are of a monolithic construction.

61. A sensor according to claim 60, characterized by an auxiliary sensor element for which one or more parameters are stored in the memory.

62. A sensor according to claim 60, characterized in that it is housed in a TO5 housing.

63. A sensor according to claim 60, characterized in that the sensor element is a thermopile.

64. An infra red radiation sensor system characterized by a sensor according to claim 60, a socket being connected to the sensor for the purpose of transmission and a correction device being connected to the socket for receiving the sensor output signal and the parameters and for the generation of a corrected sensor signal.

65. A sensor system according to claim 64, characterized in that the correction device is also designed for the evaluation of signals and/or the control or adjustment of a device in accordance with the corrected signal.

66. A microwave heating device characterized by a sensor system according to claim 65 where the sensor elements possess thermopile sensor elements.

67. A microwave heating device characterized by a sensor system according to claim 64 where the sensor elements possess thermopile sensor elements.

68. A sensor according to claim 13, characterized in that the sensor elements and the memory are of a hybrid construction.

69. A sensor according to claim 68, characterized by an auxiliary sensor element for which one or more parameters are stored in the memory.

70. A sensor according to claim 68, characterized in that it is housed in a TO5 housing.

71. A sensor according to claim 68, characterized in that the sensor element is a thermopile.

72. An infra red radiation sensor system characterized by a sensor according to claim 68, a socket being connected to the sensor for the purpose of transmission and a correction device being connected to the socket for receiving the sensor output signal and the parameters and for the generation of a corrected sensor signal.

73. A sensor system according to claim 72, characterized in that the correction device is also designed for the evaluation of signals and/or the control or adjustment of a device in accordance with the corrected signal.

74. A microwave heating device characterized by a sensor system according to claim 73 where the sensor elements possess thermopile sensor elements.

75. A microwave heating device characterized by a sensor system according to claim 72 where the sensor elements possess thermopile sensor elements.

76. A sensor according to claim 13, characterized by an auxiliary sensor element for which one or more parameters are stored in the memory.

77. A sensor according to claim 76, characterized in that it is housed in a TO5 housing.

78. A sensor according to claim 76, characterized in that the sensor element is a thermopile.

79. An infra red radiation sensor system characterized by a sensor according to claim 76, a socket being connected to the sensor for the purpose of transmission and a correction device being connected to the socket for receiving the sensor output signal and the parameters and for the generation of a corrected sensor signal.

80. A sensor system according to claim 79, characterized in that the correction device is also designed for the evaluation of signals and/or the control or adjustment of a device in accordance with the corrected signal.

81. A microwave heating device characterized by a sensor system according to claim 80 where the sensor elements possess thermopile sensor elements.

82. A microwave heating device characterized by a sensor system according to claim 79 where the sensor elements possess thermopile sensor elements.

83. A sensor according to claim 13, characterized in that it is housed in a TO5 housing.

84. A sensor according to claim 83, characterized in that the sensor element is a thermopile.

85. An infra red radiation sensor system characterized by a sensor according to claim 83, a socket being connected to the sensor for the purpose of transmission and a correction device being connected to the socket for receiving the sensor output signal and the parameters and for the generation of a corrected sensor signal.

86. A sensor system according to claim 85, characterized in that the correction device is also designed for the evaluation of signals and/or the control or adjustment of a device in accordance with the corrected signal.

87. A microwave heating device characterized by a sensor system according to claim 86 where the sensor elements possess thermopile sensor elements.

88. A microwave heating device characterized by a sensor system according to claim 85 where the sensor elements possess thermopile sensor elements.

89. A sensor according to claim 13, characterized in that the sensor element is a thermopile.

90. An infra red radiation sensor system characterized by a sensor according to claim 89, a socket being connected to the sensor for the purpose of transmission and a correction device being connected to the socket for receiving the sensor output signal and the parameters and for the generation of a corrected sensor signal.

91. A sensor system according to claim 90, characterized in that the correction device is also designed for the evaluation of signals and/or the control or adjustment of a device in accordance with the corrected signal.

92. A microwave heating device characterized by a sensor system according to claim 90 where the sensor elements possess thermopile sensor elements.

93. An infra red radiation sensor system characterized by a sensor according to claim 13, a socket being connected to the sensor for the purpose of transmission and a correction device being connected to the socket for receiving the sensor output signal and the parameters and for the generation of a corrected sensor signal.

94. A sensor system according to claim 93, characterized in that the correction device is also designed for the evaluation of signals and/or the control or adjustment of a device in accordance with the corrected signal.

95. A microwave heating device characterized by a sensor system according to claim 94 where the sensor elements possess thermopile sensor elements.

96. A microwave heating device characterized by a sensor system according to claim 93 where the sensor elements possess thermopile sensor elements.

* * * * *

UNITED STATES PATENT AND TRADEMARK OFFICE
CERTIFICATE OF CORRECTION

PATENT NO. : 6,871,999 B2
APPLICATION NO. : 10/168484
DATED : March 29, 2005
INVENTOR(S) : Jorg Schieferdecker et al.

It is certified that error appears in the above-identified patent and that said Letters Patent is hereby corrected as shown below:

Cover page, (56) References Cited, U.S. PATENT DOCUMENTS, please add the following references that were cited by the Examiner in the non-final Office Action mailed on October 3, 2003:

| Document Number Country Code-Number-Kind Code | Date MM-YYYY | Name | Classification |
|---|---|---|---|
| US-6,294,787 B1 | 09-2001 | Schieferdecker et al. | 250/349 |
| US-6,032,109 A | 02-2000 | Ritmiller, III, George R. | 702/104 |
| US-5,857,777 A | 01-1999 | Schuh, William C. | 374/172 |
| US-5,826,982 A | 10-1998 | Schieferdecker et al. | 374/149 |
| US-5,796,081 A | 08-1998 | Carlsson et al. | 374/149 |
| US-5,695,283 A | 12-1997 | Johnson, Bruce C. | 374/133 |
| US-5,604,918 A | 02-1997 | Huijsing et al. | 710/72 |
| US-5,589,094 A | 12-1996 | Bu, Jong U. | 219/711 |
| US-5,425,361 A | 06-1995 | Fenzlein et al. | 600/345 |
| US-5,281,786 A | 01-1994 | Park, Jong I. | 219/706 |
| US-5,150,969 A | 09-1992 | Goldberg et al. | 374/128 |
| US-4,752,694 A | 06-1988 | Hegel et al. | 374/128 |

In column 1, line 7, change "an infra radiation multiple element sensor" to --an infra red radiation multiple element sensor--, as shown in the specification on page 1, line 2.

In column 1, lines 22-26, delete the following paragraph: "It is the purpose of the invention to provide a correction method for output signals of an infra red radiation multiple element sensor and an infra red radiation multiple element sensor system which makes possible a simple, reliable and cost-effective correction of sensor element signals." and add the following paragraph in its place: --An infrared camera system is known from WO 96 10883 A, where the camera calibration constants are determined while operating the camera and put in the camera memory. This structure is in the first place a camera and second the correction data is not provided within the sensor.--, as shown in the specification at page 1, line 18.

In column 1, line 39, change "to achieve the later" to --to achieve the latter--.

In column 2, line 5, change "(erasable programmable read-only memory) The" to --(erasable programmable read-only memory). The--.

In column 2, line 8, change "in particularly 7 $\mu$m < $\lambda$ and/or $\lambda$ < 15 $\mu$m" to --in particular 7 $\mu$m < $\lambda$ and/or $\lambda$ < 15 $\mu$m.--.

UNITED STATES PATENT AND TRADEMARK OFFICE
CERTIFICATE OF CORRECTION

PATENT NO. : 6,871,999 B2
APPLICATION NO. : 10/168484
DATED : March 29, 2005
INVENTOR(S) : Jorg Schieferdecker et al.

It is certified that error appears in the above-identified patent and that said Letters Patent is hereby corrected as shown below:

In column 2, line 43, change "FIG. 5 is a signal flow plan" to --FIG. 5 is a signal flow plan.--

In column 3, line 46, change "serve for the detectation" to --serves for the detection--.

In column 4, line 14, change "some bolometers and some pyroelectric)" to --some bolometers and some pyroelectric).--

In claim 34, column 9, line 12, change "sensor according to claim 27," to --A sensor according to claim 27,--, as shown in the After Final Amendment dated August 18, 2004 on page 12 at claim 73, now claim 34.

In claim 52, column 10, line 4, change "A sensor according to claim 50 characterized in that" to --A sensor according to claim 50, characterized in that--, as shown in the After Final Amendment dated August 18, 2004 on page 10 at claim 58, now claim 52.

Signed and Sealed this

Twenty-sixth Day of June, 2007

JON W. DUDAS
*Director of the United States Patent and Trademark Office*